United States Patent
Wakabayashi

(10) Patent No.: US 8,847,938 B2
(45) Date of Patent: Sep. 30, 2014

(54) IMAGING DEVICE, METHOD FOR CONTROLLING THE IMAGING DEVICE, AND CAMERA USING THE IMAGING DEVICE

(75) Inventor: Hayato Wakabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 194 days.

(21) Appl. No.: 12/741,269

(22) PCT Filed: Sep. 16, 2009

(86) PCT No.: PCT/JP2009/066128
§ 371 (c)(1),
(2), (4) Date: May 4, 2010

(87) PCT Pub. No.: WO2010/035668
PCT Pub. Date: Apr. 1, 2010

(65) Prior Publication Data
US 2010/0231574 A1    Sep. 16, 2010

(30) Foreign Application Priority Data

Sep. 25, 2008  (JP) ................................ 2008-245483

(51) Int. Cl.
*G06F 3/038* (2013.01)
*G09G 5/00* (2006.01)
*G09G 3/36* (2006.01)
*H04N 5/357* (2011.01)
*H04N 5/376* (2011.01)
*H04N 5/374* (2011.01)
*H01L 27/146* (2006.01)

(52) U.S. Cl.
CPC .......... *H04N 5/357* (2013.01); *H01L 27/14621* (2013.01); *H04N 5/376* (2013.01); *H04N 5/3741* (2013.01); *H01L 27/14643* (2013.01)

USPC .......... 345/210; 345/204; 345/205; 345/208; 345/104; 348/294

(58) Field of Classification Search
USPC .......... 345/204, 205, 76–78, 82, 87, 90, 104, 345/208, 210
See application file for complete search history.

(56) References Cited

U.S. PATENT DOCUMENTS 6,867,409 B2 *   3/2005   Kusuda et al. ............. 250/208.1
7,053,874 B2 *   5/2006   Koyama ......................... 345/82

FOREIGN PATENT DOCUMENTS

EP   1469669 A2   10/2004
JP   11-112018    4/1999
(Continued)

OTHER PUBLICATIONS

International Search Report dated Sep. 25, 2008.
Extended European Search Report issued in connection with related EP Application No. 09816083 dated Apr. 15, 2014.

*Primary Examiner* — Ilana Spar
(74) *Attorney, Agent, or Firm* — Dentons US LLP

(57) ABSTRACT

An imaging device that can not only reduce noises including shading but also read out a pixel at high speed, a method for controlling the imaging device, and a camera using the imaging device are provided. In a 3-transistor-driven pixel circuit 11, the drain of a reset transistor 113 is connected to a drive signal line DRNL (n), and the drain of an amplifier transistor 114 is connected to a source voltage VDD. A row drive circuit 12a quickly decreases the voltage level applied to the drive signal line DRNL (n) from a high-level voltage VH to a lowest level voltage VLL, then increases it from the lowest level voltage VLL to a low-level voltage VL, and then gradually returns it to the high-level voltage VH.

8 Claims, 8 Drawing Sheets

(56) References Cited

FOREIGN PATENT DOCUMENTS

| JP | 11112018 A | * | 4/1999 |
| JP | 2005-217704 | | 8/2005 |
| JP | 2005-217705 | | 8/2005 |
| JP | 2005217704 A | * | 8/2005 |
| JP | 2005-311932 | | 11/2005 |
| JP | 2008-167478 | | 7/2008 |

* cited by examiner

IMAGING DEVICE, METHOD FOR CONTROLLING THE IMAGING DEVICE, AND CAMERA USING THE IMAGING DEVICE

TECHNICAL FIELD

The present invention relates to an imaging device such as CMOS (Complementary Metal Oxide Semiconductor) image sensor, a method for controlling the imaging device, and a camera using the imaging device.

BACKGROUND ART

In a CMOS image sensor, reset is performed to remove excess charge from a photoelectric conversion device, an electronic shutter operates to cause the photoelectric conversion device to store charge, and the stored charge is outputted as voltage signal to a vertical signal line. Now, the main part of a conventional CMOS image sensor and the operation thereof is briefly described below with reference to FIGS. 13 and 14.

FIG. 13 is an equivalent circuit diagram of the main part showing an example of configuration of the conventional CMOS image sensor.

FIG. 14 is a timing chart of the CMOS image sensor shown in FIG. 13. FIG. 14(A) shows a drive signal SDRN. FIG. 14(B) shows a reset signal SRST. FIG. 14(C) shows a transfer signal STRN.

A pixel circuit 30 of a CMOS image sensor 3 shown in FIG. 13 is placed in a pixel section 311. The pixel circuit 30 includes a transfer transistor 32, a reset transistor 33 and an amplifier transistor 34, and is driven by a row drive circuit 37. The pixel circuit 30 configured as shown in FIG. 13 is referred to as "3-transistor-driven pixel circuit," "3-transistor-driven CMOS image sensor" or the like.

The row drive circuit 37 includes a transistor 39 for applying the drive signal SDRN of a low-level voltage VL to a drive signal line 310, and a transistor 38 for applying the drive signal SDRN of a high-level voltage VH to the drive signal line 310. The high-level voltage VH is, for example, a source voltage VDD, and the low-level voltage VL is a voltage for holding the amplifier transistor 34 in off-state.

When the pixel circuit 30 is a 3-transistor-driven pixel circuit, the row drive circuit 37 applies a binary voltage of the low-level voltage VL or high-level voltage VH to the drive signal line 310 to drive the pixel circuit 30.

During a period from time t1 to time t4, the row drive circuit 37 applies a gate voltage VL to the gate of the transistor 38 to hold only the transistor 38 in on-state and apply the drive signal SDRN of the high-level voltage VH to the drive signal line 310 (see FIG. 14(A)).

Before a photoelectric conversion device 31 starts to read charge (time t2), the row drive circuit 37 applies a pulse of the reset signal SRST to a reset signal line RSTL connected to the gate of the reset transistor 33 (see FIG. 14(B)). This resets the potential of a floating diffusion FD to the high-level voltage VH.

At time t3, the row drive circuit 37 applies a pulse of the transfer signal STRN to a transfer signal line TRNL connected to the gate of the transfer transistor 32 (see FIG. 14(C)). This transfers the charge stored by the photoelectric conversion device 31 to the floating diffusion FD.

At this point, the amplifier transistor 34 has the potential of the floating diffusion FD applied at the gate, and has the high-level voltage VH applied at the drain. Accordingly, the amplifier transistor 34 amplifies the potential of the floating diffusion FD depending on the voltage between the source and the gate, and outputs the amplified potential as voltage signal to a vertical signal line 35. The outputting of voltage signal from the amplifier transistor 34 is referred to as "the reading-out of charge," "the reading-out of pixel" or the like, and is continued until time t4.

After reading out the charge, during a period from time t4 to time t5, the row drive circuit 37 holds only the transistor 39 in on-state to apply the drive signal SDRN of the low-level voltage VL to the drive signal line 310 (see FIG. 14(A)), and applies a pulse of the reset signal SRST to the reset signal line RSTL (see FIG. 14(B)).

After the low-level voltage VL is applied to the gate of the amplifier transistor 34 (floating diffusion FD), the reset signal SRST returns to the low-level voltage VL.

This holds the amplifier transistor 34 in off-state, causing the pixel circuit 30 to be in non-selected state in which outputting voltage signal is stopped, which completes the operation of the CMOS image sensor 3 in one horizontal period H.

As described above, when the charge is read out, the voltage signal from the pixel circuit 30 is applied to the vertical signal line 35, causing the potential of the vertical signal line 35 to change.

At this point, even if the number of pixel circuits 30 in non-selected state is small, when the pixel circuits 30 in non-selected state output voltage signals to the vertical signal line 35, these voltage signals are superimposed on voltage signals outputted from pixel circuits 30 of a read-out row. Consequently, the output voltages from the pixel circuits have an effect on the whole pixel area, causing various noises including shading.

These phenomena are closely related to how the drive signal SDRN falls at time t4. The more steeply the drive signal SDRN falls (see FIG. 14), the more intensely the potentials of the p-type wells of transistors included in the pixel circuit 30 fluctuate, causing phenomena including shading.

Thus, a method for reducing phenomena including shading by using a multivalued drive signal SDRN having different voltage levels and falling more gently is disclosed (see Patent Documents 1, 2).

RELATED ART DOCUMENT

Patent Document

Patent Document 1: JP-A-2005-217704
Patent Document 2: JP-A-2005-311932

SUMMARY OF THE INVENTION

Problems to be Solved by the Invention

According to Patent Documents 1, 2, in the 3-transistor-driven pixel circuit, the drain of the reset transistor 33 and the drain of the amplifier transistor 34 are commonly connected to the drive signal line 310, as shown in FIG. 13.

This increases load resistance of the wiring of the drive signal line 310, causing attenuation and delay of the drive signal SDRN, which makes it difficult to drive the pixel circuit 30 at high speed. In Patent Documents 1, 2, the multivalued drive signal SDRN is applied to the drive signal line 310. However, this intends to slow down the falling of the pulse, which is not suitable for reading out a pixel at high speed.

The present invention provides an imaging device that can not only reduce noises including shading but also read out a pixel at high speed, a method for controlling the imaging device, and a camera using the imaging device.

Means for Solving the Problems

In accordance with a first aspect of the present invention, an imaging device includes: a plurality of pixel circuits arranged in a matrix; a selection drive line commonly connected to the plurality of pixel circuits arranged in the same direction; and a selection drive circuit for selectively applying a selection drive signal having plural different voltage levels to the selection drive line to select and drive the pixel circuits, in which each of the pixel circuits includes: a photoelectric converter for photoelectrically converting incident light into charge; a node to which the charge is transferred from the photoelectric converter; an output transistor having a control terminal connected to the node, a first connection terminal connected to a predetermined voltage source, and a second connection terminal connected to an output signal line, and for amplifying the potential of the node and outputting the amplified voltage as output signal to the output signal line; and a control transistor having a third connection terminal connected to the node and a fourth connection terminal connected to the selection drive line to which the selection drive signal is applied, and for setting the potential of the node to which the control terminal of the output transistor is connected, to a potential depending on the voltage level and controlling the reset of the potential of the node and the output of the output transistor, and in which, in a period during which the output of the output transistor is stopped, the selection drive circuit shifts the voltage level of the selection drive signal applied to the selection drive line from a first voltage level for holding the output transistor in on-state to a second voltage level exceeding a reference voltage level for holding the output transistor in off-state and gradually returns the voltage level of the selection drive signal from the second voltage level to the first voltage level.

Preferably, the plural voltage levels include: the first voltage level; the second voltage level; and a third voltage level that is a reference voltage level for holding the output transistor in off-state, in which the selection drive circuit shifts the voltage level of the selection drive signal applied to the selection drive line from the first voltage level to the second voltage level and returns the voltage level of the selection drive signal to the first voltage level via the third voltage level.

Preferably, the selection drive circuit applies the selection drive signal of the second voltage level to the selection drive line for a period shorter than that for the selection drive signal of the voltage level other than the second voltage level.

Preferably, the selection drive circuit includes: a transistor having a fifth connection terminal applied with the voltage of one of the second and third voltage levels, and for outputting the voltage of the voltage level applied to the fifth connection terminal to the selection drive line; and an anti-short-circuit transistor having the same polarity as the transistor and for preventing short-circuit in the selection drive circuit, in which the anti-short-circuit transistor has a seventh connection terminal connected to a sixth connection terminal of the transistor and has an eighth connection terminal connected to the selection drive line.

Preferably, the selection drive circuit applies the selection drive signal to both ends of the selection drive line.

In accordance with a second aspect of the invention, a method for controlling an imaging device includes: a first step of selectively applying a selection drive signal having different voltage levels to a selection drive line commonly connected to a plurality of pixel circuits arranged in the same direction to select and drive the plurality of pixel circuits, in which the selected plurality of pixel circuits photoelectrically convert incident light into charge and output voltage depending on the amount of the charge as output signal to an output signal line; and a second step of stopping the output signal from the plurality of pixel circuits for a predetermined period after the reading-out of the charge by the plurality of pixel circuits, the first step including: transferring the charge photoelectrically converted by a photoelectric converter to a node, in which a control transistor having a third connection terminal connected to the node and a fourth connection terminal connected to the selection drive line to which the selection drive signal is applied sets the potential of the node to which the control terminal of an output transistor is connected, to a potential depending on the voltage level, and resets the potential of the node, and in which the output transistor having the control terminal connected to the node, a first connection terminal connected to a predetermined voltage source, and a second connection terminal connected to the output signal line amplifies the potential of the node and outputs the amplified voltage as the output signal to the output signal line under the control of the control transistor, and the second step including: shifting the voltage level of the selection drive signal applied to the selection drive line from a first voltage level for holding the output transistor in on-state to a second voltage level exceeding a voltage level for holding the output transistor in off-state and gradually returning the voltage level of the selection drive signal from the second voltage level to the first voltage level.

In accordance with a third aspect of the invention, an camera includes: an imaging device; an optical system for guiding incident light to a pixel area of the imaging device; and a signal processor for processing output signal outputted from the imaging device, the imaging device including: a plurality of pixel circuits arranged in a matrix; a selection drive line commonly connected to the plurality of pixel circuits arranged in the same direction; and a selection drive circuit for selectively applying a selection drive signal having different voltage levels to the selection drive line to select and drive the pixel circuits, in which each of the pixel circuits includes: a photoelectric converter for photoelectrically converting incident light into charge; a node to which the charge is transferred from the photoelectric converter; an output transistor having a control terminal connected to the node, a first connection terminal connected to a predetermined voltage source, and a second connection terminal connected to an output signal line, and for amplifying the potential of the node and outputting the amplified voltage as output signal to the output signal line; and a control transistor having a third connection terminal connected to the node and a fourth connection terminal connected to the selection drive line to which the selection drive signal is applied, and for setting the potential of the node to which the control terminal of the output transistor is connected, to a potential depending on the voltage level and controlling the reset of the potential of the node and the output of the output transistor, and in which, in a period during which the output of the output transistor is stopped, the selection drive circuit shifts the voltage level of the selection drive signal applied to the selection drive line from a first voltage level for holding the output transistor in on-state to a second voltage level exceeding a reference voltage level for holding the output transistor in off-state and gradually returns the voltage level of the selection drive signal from the second voltage level to the first voltage level.

According to the invention, the output transistor having the control terminal connected to the node, the first connection terminal connected to a predetermined voltage source, and the second connection terminal connected to the output signal line amplifies the potential of the node and outputs the amplified voltage as output signal to the output signal line.

The control transistor having the third connection terminal connected to the node and the fourth connection terminal connected to the selection drive line to which the selection drive signal is applied sets the potential of the node to a potential depending on the voltage level and controls the reset of the potential of the node and the output of the output transistor.

The selection drive circuit selectively applies a selection drive signal having different voltage levels to the selection drive line commonly connected to the plurality of pixel circuits arranged in the same direction, and, in a period during which the output of the output transistor is stopped, shifts the voltage level applied to the selection drive line from the first voltage level to the second voltage level and gradually returns the voltage level from the second voltage level to the first voltage level.

Advantage of the Invention

According to the invention, not only reducing noises including shading but also reading out a pixel at high speed is possible.

MODE FOR CARRYING OUT THE INVENTION

Embodiments of the invention are described below with reference to the drawings.

First Embodiment

Figure 1:
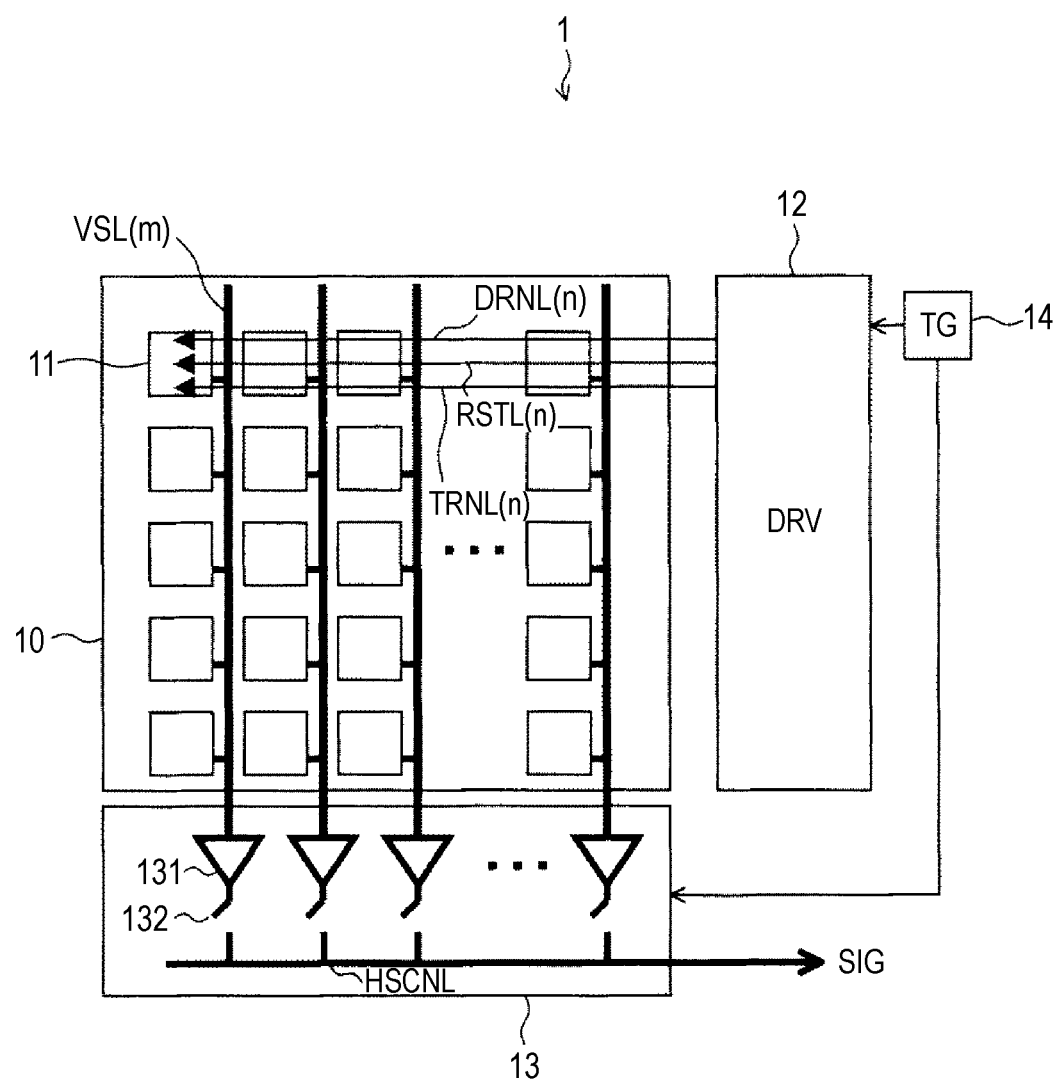
FIG. 1 is a schematic configuration diagram showing an example of configuration of a CMOS image sensor in accordance with a first embodiment.

FIG. 1 is a schematic configuration diagram showing an example of configuration of a CMOS image sensor in accordance with a first embodiment. FIG. 1 shows only the main part of a CMOS image sensor 1.

As shown in FIG. 1, the CMOS image sensor (CMOS) 1 includes a plurality of pixel sections 10, pixel circuits 11, a row drive circuit (DRV) 12, a horizontal transfer circuit 13 and a timing generator 14.

Note that an imaging device in the invention corresponds to the CMOS image sensor 1, a pixel area in the invention corresponds to the pixel section 10, and a selection drive circuit in the invention corresponds to the row drive circuit 12.

The pixel section 10 is a pixel area for receiving incident light and includes n×m pixel circuits 11 arranged in a matrix of n rows by m columns. n and m are positive integers, and each may be up to 2048, for example.

Each pixel circuit 11 is a 3-transistor-driven pixel circuit. Each pixel circuit 11 is covered with a color filter of R (red), G (green) or B (blue), and is arranged according to, for example, Bayer pattern. A drive signal line DRNL (n), a reset signal line RSTL (n) and a transfer signal line TRNL (n) are commonly connected to the pixel circuits 11 belonging to the same row.

Each pixel circuit 11 photoelectrically converts incident light into charge (electron) and outputs voltage signal depending on the amount of the charge to a vertical signal line VSL (m).

Note that a selection drive line in the invention corresponds to the drive signal line DRNL (n), an output signal line in the invention corresponds to the vertical signal line VSL (m), and an output signal in the invention corresponds to a digital signal.

The row drive circuit 12 selects a row to be scanned and drives the pixel circuits 11 belonging to the same row. Specifically, the row drive circuit 12 applies a drive signal SDRN to the drive signal line DRNL (n), applies a reset signal SRST to the reset signal line RSTL (n), and applies a transfer signal STRN to the transfer signal line TRNL (n).

The horizontal transfer circuit 13 includes, for example, a column circuit 131 provided for each column, a switch 132 for selecting the vertical signal line VSL (m) for each column, and a horizontal transfer signal line HSCNL.

The horizontal transfer circuit 13 sequentially selects the vertical signal line VSL (m) by opening/closing the switch 132 for each column, and reads out charge (voltage signal) from the pixel circuits 11 of the selected column. At this point, the column circuit 131 converts the analog voltage signal applied into the vertical signal line (m) to digital signal, performs correlated double sampling (CDS) processing at the reset level and the signal level, and outputs this digital signal to the horizontal transfer signal line HSCNL. Then, the horizontal transfer circuit 13 outputs the CDS-processed digital signal as output signal SIG to a signal processor external to the CMOS image sensor 1.

The timing generator 14 provides clock signals to the row drive circuit 12, the horizontal transfer circuit 13, circuits included in the CMOS image sensor 1, and the like.

Next, the pixel circuits 11 and the row drive circuit 12 are described with reference to FIG. 2.

Figure 2:
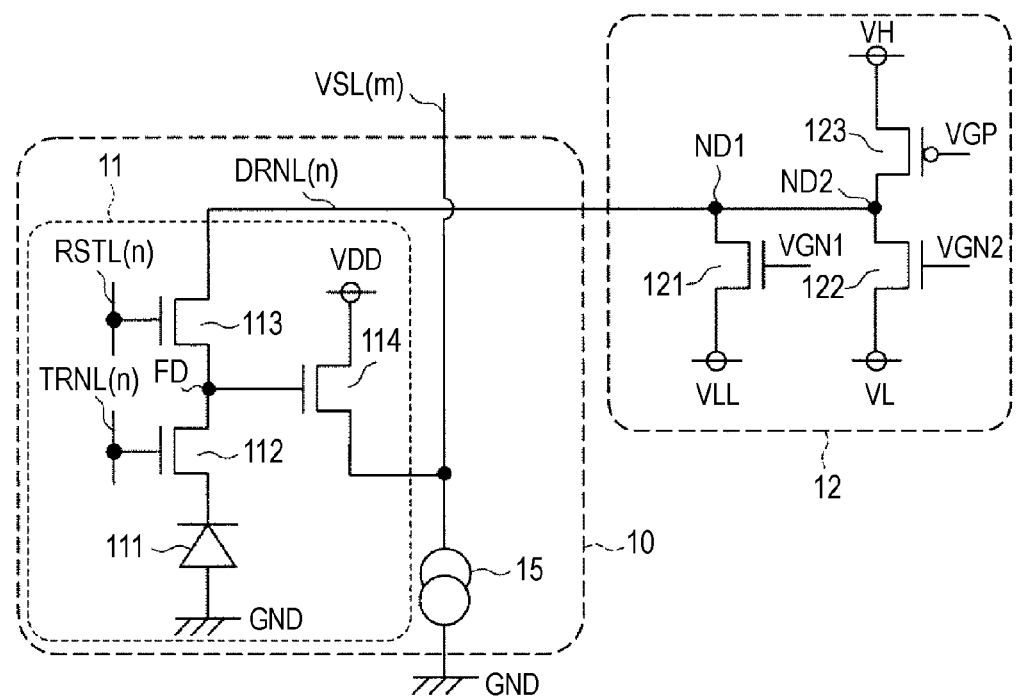
FIG. 2 is an equivalent circuit diagram showing an example of configuration of a pixel circuit and a row drive circuit in accordance with the first embodiment.

FIG. 2 is an equivalent circuit diagram showing an example of configuration of the pixel circuit and the row drive circuit in accordance with the first embodiment. FIG. 2 shows one pixel circuit 11 placed in the n-th row and m-th column of the pixel section 10 and only the main part of the row drive circuit 12.

First, an example of circuit configuration of the pixel circuit 11 is described.

As shown in FIG. 2, the pixel circuit 11 of the pixel section 10 includes a photoelectric conversion device 111, a transfer transistor 112, a reset transistor 113, an amplifier transistor 114 and a floating diffusion FD. The pixel circuit 11 is a 3-transistor-driven pixel circuit.

Note that an output transistor in the invention corresponds to the amplifier transistor 114, a control transistor in the invention corresponds to the reset transistor 113, and a node in the invention corresponds to the floating diffusion FD. A predetermined voltage source in accordance with the invention corresponds to a source voltage VDD connected to the drain of the amplifier transistor 114.

The photoelectric conversion device 111 is, for example, a photodiode. The photoelectric conversion device 111 has the anode connected to the ground (GND) and the cathode connected to the source of the transfer transistor 112. The photoelectric conversion device 111 photoelectrically converts incident light to charge (in this embodiment, electron) depending on the amount of light and stores the charge. That the photoelectric conversion device 111 stores charge is referred to as "the pixel circuit stores charge." A period during which the photoelectric conversion device 111 stores charge is referred to as charge storing period.

As an example, an n-channel MOSFET (metal oxide semiconductor field effect transistor) is used for the transistors of the pixel circuit 11. These transistors are connected as follows.

The transfer transistor 112 has the source connected to the cathode of the photoelectric conversion device 111, the drain connected to the floating diffusion FD, and the gate connected to the transfer signal line TRNL (n).

To the floating diffusion FD, the drain of the transfer transistor 112, the source of the reset transistor 113, and the gate of the amplifier transistor 114 are connected.

The reset transistor 113 has the source (a third connection terminal) connected to the floating diffusion FD, the drain (a fourth connection terminal) connected to the drive signal line DRNL (n), and the gate connected to the reset signal line RSTL (n).

The amplifier transistor 114 has the source (a second connection terminal) connected to the vertical signal line VSL (m), the drain (a first connection terminal) connected to the source voltage VDD, and the gate connected to the floating diffusion FD. The amplifier transistor 114 and a constant current source circuit 15 form a source follower circuit.

As described above, the first embodiment is characterized in that the drain of the reset transistor 113 and the drain of the amplifier transistor 114 are applied with voltage from different voltage supply sources.

Each pixel circuit 11 performs "reset" to set the potential of the floating diffusion FD equal to the potential of the drive signal line DRNL (n) (high-level voltage VH).

Then, the charge stored by the photoelectric conversion device 111 is transferred to the floating diffusion FD to be read out.

Next, an example of circuit configuration of the main part of the row drive circuit 12 is described.

The row drive circuit 12 includes level transistors 121, 122, 123 for each row. FIG. 2 shows only the n-th row part of the circuit including the level transistors 121, 122, 123.

As an example, n-channel MOSFETs are used for the level transistors 121 and 122, and a p-channel MOSFET is used for the level transistor 123.

The level transistors 121 has the source connected to a voltage source of a lowest level voltage VLL and the drain connected to a node ND1.

The drains of the level transistors 122 and 123 are commonly connected to a node ND2. The source of the level transistor 122 is connected to a voltage source of a low-level voltage VL. The source of the level transistor 123 is connected to a voltage source of a high-level voltage VH.

Nodes ND1 and ND2 are commonly connected to the drive signal line DRNL (n).

The high-level voltage VH is, for example, the source voltage VDD. The lowest level voltage VLL is lower than the low-level voltage VL (VL>VLL), and is, for example, the ground potential GND.

The low-level voltage VL is lower than the high-level voltage VH and higher than the lowest level voltage VLL (VH>VL>VLL). Specifically, the low-level voltage VL is a reference voltage (for example, 0.6 V) that can hold the amplifier transistor 114 in off-state when applied to the gate of the amplifier transistor 114.

Note that a first voltage level in the invention corresponds to the high-level voltage VH, a second voltage level in the invention corresponds to the lowest level voltage VLL, and a third voltage level in the invention corresponds to the low-level voltage VL.

The row drive circuit 12 configured as above selectively applies the drive signal SDRN of three voltage level values to the drive signal line DRNL (n), the three voltage level values including the high-level voltage VH, the low-level voltage VL, and the lowest level voltage VLL. The operation of the row drive circuit 12 is described below with reference to FIG. 3.

Figure 3:
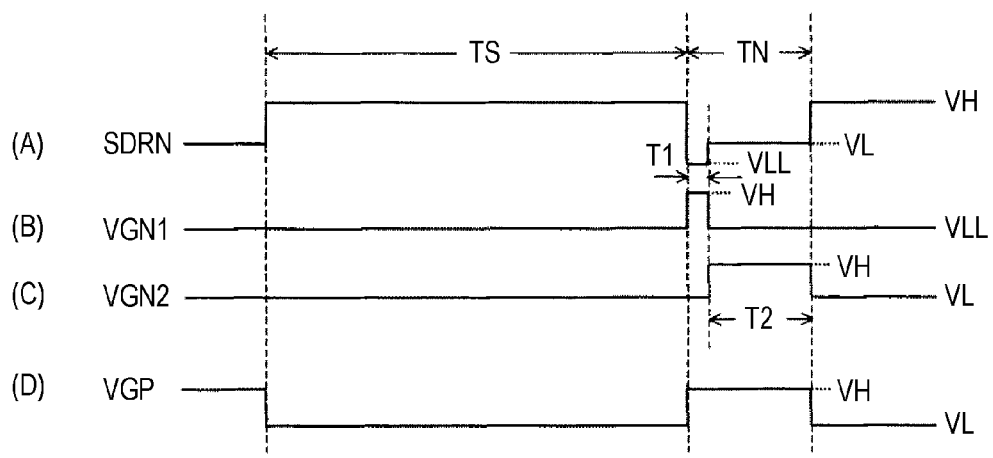
FIG. 3 is a timing chart showing an example of operation of the row drive circuit in accordance with the first embodiment.

FIG. 3 is a timing chart showing an example of operation of the row drive circuit in accordance with the first embodiment.

FIG. 3(A) shows the drive signal SDRN. FIG. 3(B) shows a gate voltage VGN1 applied to the gate of the level transistor 121. FIG. 3(C) shows a gate voltage VGN2 applied to the gate of the level transistor 122. FIG. 3(D) shows a gate voltage VGP applied to the gate of the level transistor 123.

In order to apply the drive signal SDRN shown in FIG. 3(A) to the drive signal line DRNL (n), the row drive circuit 12 operates as follows.

In a selected-state period TS for the pixel circuit 11 in the n-th row, in order to activate the reset transistor 113 to control the output of the amplifier transistor 114, the row drive circuit 12 applies the drive signal SDRN of the high-level voltage VH to the drive signal line DRNL (n).

Note that the selected-state period TS is a period within which the pixel circuit 11 completes the reading-out of the charge.

At this point, the row drive circuit 12 applies the low-level voltage VL only to the gate of the level transistor 123 (see FIG. 3(D)). Since the gate voltage VGP is the low-level voltage VL, the level transistor 123 is held in on-state during the selected-state period TS, and the drive signal SDRN of the high-level voltage VH is applied to the drive signal line DRNL (n).

On the other hand, in a non-selected-state setting period TN for the pixel circuit 11, in order to stop the output of the amplifier transistor 114, the row drive circuit 12 applies the drive signal SDRN of low-level voltage VL to the drive signal line DRNL (n).

However, at the beginning of the non-selected-state setting period TN, the row drive circuit 12 quickly decreases the voltage level of the drive signal SDRN from the high-level voltage VH to the lowest level voltage VLL.

Note that the non-selected-state setting period TN is a period within which the row drive circuit 12 applies the low-level voltage VL to the drive signal line DRNL (n) in order to cause the amplifier transistor 114 to stop outputting voltage signal to the vertical signal line VSL (m).

In more detail, at this point, the row drive circuit 12 applies the high-level voltage VH to the gate of the level transistor 123 (see FIG. 3(D)). Since the gate voltage VGP is the high-level voltage VH, the level transistor 123 is held in off-state during the non-selected-state setting period TN.

At the beginning of the non-selected-state setting period TN, the row drive circuit 12 applies a short pulse of the high-level voltage VH with a pulse width of T1 to the gate of the level transistor 121 (see FIG. 3(B)). Note that, during this pulse, the level transistor 122 is held in off-state.

Since the gate voltage VGN1 is the high-level voltage VH, only the level transistor 121 is held in on-state, and the drive signal SDRN of the lowest level voltage VLL is applied to the drive signal line DRNL (n).

As a result, as shown in FIG. 3(A), the drive signal SDRN quickly falls from the high-level voltage VH to the lowest level voltage VLL.

At the beginning of the next selected-state period TS, the drive signal SDRN needs to rise from the lowest level voltage VLL to the high-level voltage VH. At this point, the row drive circuit 12 cause the drive signal SDRN to gradually return from the lowest level voltage VLL to the high-level voltage VH.

Specifically, after applying the short pulse of the high-level voltage VH to the gate of the level transistor 121, the row drive circuit 12 applies the high-level voltage VH to the gate of the level transistor 122 during a period T2 until the end of the non-selected-state setting period TN (see FIG. 3(C)). Of course, the pulse width of T1 is extremely shorter than the period T2 (T2>>T1).

Since the gate voltage VGN2 is the high-level voltage VH, only the level transistor 122 is held in on-state, and the drive signal SDRN of the low-level voltage VL is applied to the drive signal line DRNL (n).

As a result, as shown in FIG. 3(A), the drive signal SDRN rises from the lowest level voltage VLL to the low-level voltage VL for placing the amplifier transistor 114 in off-state, and then slowly returns to the high-level voltage VH. The voltage to which the drive signal SDRN quickly falls at the beginning of the non-selected-state setting period TN (the lowest level voltage VLL) may be considered as undershoot exceeding the low-level voltage VL.

As described above, during the non-selected-state setting period TN, the row drive circuit 12 causes the drive signal SDRN to quickly fall from the high-level voltage VH to the lowest level voltage VLL and rise from the lowest level voltage VLL to the low-level voltage VL and then slowly return to the high-level voltage VH, which shortens the non-selected-state setting period TN and enabling the driving of the pixel circuit 11 at high speed.

(Variation of Row Drive Circuit 12)

In the row drive circuit 12, when the drive signal SDRN falls, the level transistor 121 is held in on-state, and the level transistor 122 is held in off-state (the period T1 in FIG. 3).

At this point, since the low-level voltage VL is higher than the lowest level voltage VLL (VL>VLL), the potential difference between them may cause a short-circuit in the row drive circuit 12 due to a parasitic diode of the level transistor 122.

Figure 4:
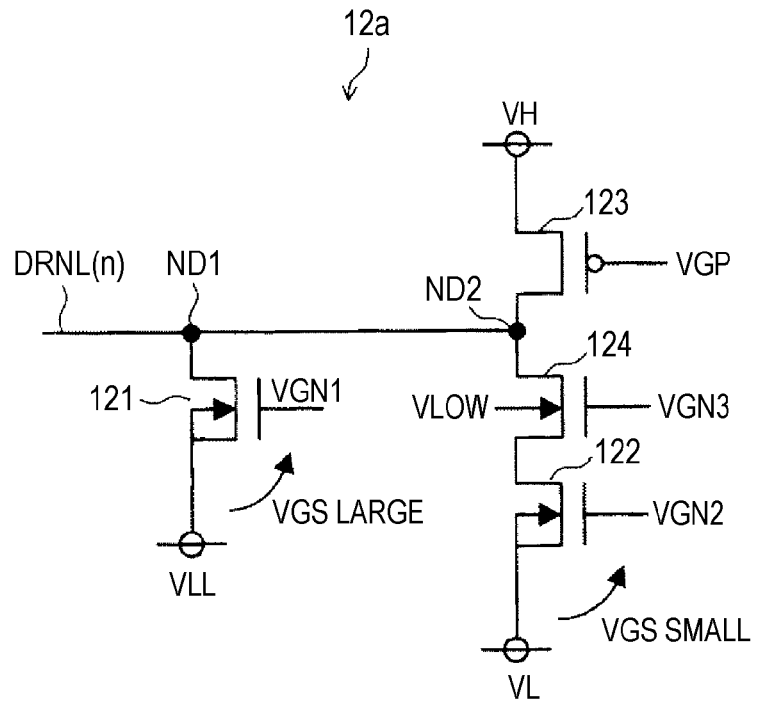
FIG. 4 is an equivalent circuit diagram showing a variation of the row drive circuit in accordance with the first embodiment.

In order to prevent the short-circuit as above, a row drive circuit 12a of this variation is configured as shown in FIG. 4.

FIG. 4 is an equivalent circuit diagram showing a variation of the row drive circuit in accordance with the first embodiment. FIG. 4 shows only the n-th row part of the circuit.

As shown in FIG. 4, the row drive circuit 12a includes a level transistor 124 in addition to the level transistors 121, 122, 123. As an example, an n-channel MOSFET is used for the level transistor 124.

The level transistor 124 is placed between the node ND2 and the level transistor 122. In more detail, the level transistor 124 has the source connected to the drain of the level transistor 122 and the drain connected to the node ND2.

Note that a first transistor in the invention corresponds to the level transistor 122, and a second transistor in the invention corresponds to the level transistor 124.

Figure 5:
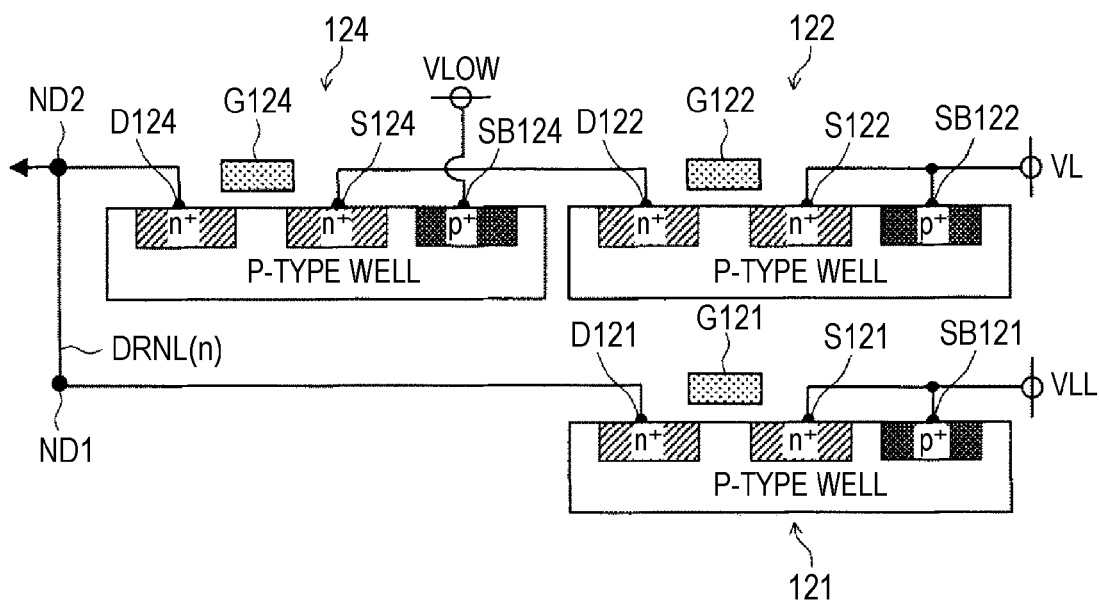
FIG. 5 is a cross-sectional schematic diagram of level transistors shown in FIG. 4.

FIG. 5 is a cross-sectional schematic diagram of the level transistors shown in FIG. 4. However, the level transistor 123 is not shown in FIG. 5.

In FIG. 5, S121, S122 and S124 denote the source electrodes of the level transistors 121, 122 and 124, respectively. D121, D122 and D124 denote the drain electrodes of the level transistors 121, 122 and 124, respectively. G121, G122 and G124 denote the gate wirings of the level transistors 121, 122 and 124, respectively.

As shown in FIG. 5, the substrate SB121 of the level transistor 121 is connected to a voltage source of the lowest level voltage VLL. The substrate SB122 of the level transistor 122 is connected to a voltage source of the low level voltage VL. The substrate SB124 of the level transistor 124 is connected to a voltage source of a lowest level voltage VLOW.

The lowest level voltage VLOW is equal to or lower than the lowest level voltage VLL (VLL≥VLOW). VLOW may be a negative voltage (for example, −1 V). In this variation, VLOW is the ground potential GND equal to the lowest level voltage VLL.

If the level transistor 124 is not placed as shown in FIG. 5, when the drive signal SDRN falls, a current due to a parasitic diode (the current flowing between the p-type well layer and drain layer of the level transistor 122) may occur, causing a short-circuit in the circuit.

Placing the level transistor 124 between the node ND2 and the level transistor 122 can prevent the current due to the parasitic diode from occurring, preventing the short-circuit in the circuit.

Next, the operation of the row drive circuit 12a shown in FIG. 4 is described.

Figure 6:
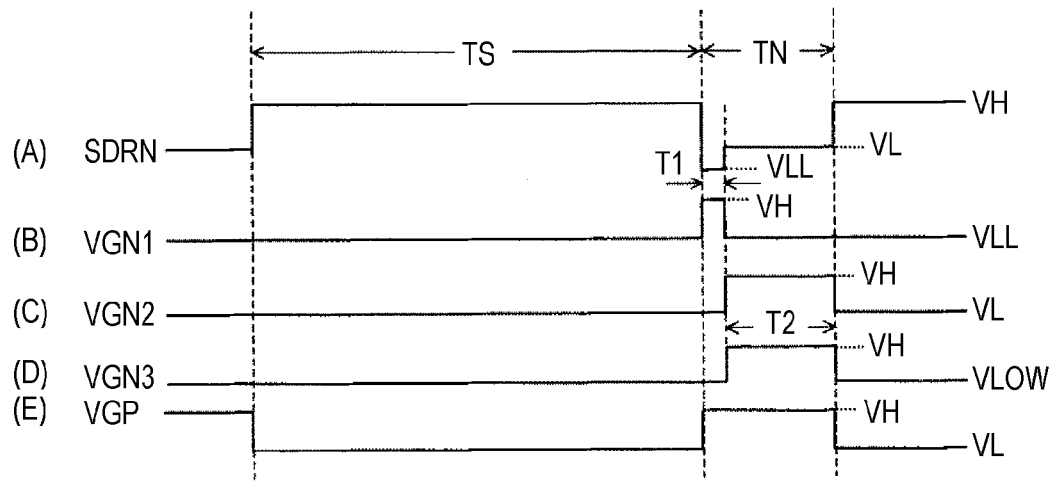
FIG. 6 is a timing chart showing an example of operation of the row drive circuit shown in FIG. 4.

FIG. 6 is a timing chart showing an example of operation of the row drive circuit shown in FIG. 4.

Note that FIG. 6(D) shows a gate voltage VGN3 applied to the gate of the level transistor 124, and FIG. 6(E) shows a gate voltage VGP applied to the gate of the level transistor 123.

A drive signal SDRN, a gate voltage VGN1 applied to the gate of the level transistor 121 and a gate voltage VGN2 applied to the gate of the level transistor 122 shown in FIGS. 6(A), 6(B) and 6(C), respectively, are identical to those of the row drive circuit 12 shown in FIGS. 3(A), 3(B) and 3(C).

As shown in FIGS. 6(C) and 6(D), the row drive circuit 12a applies the gate voltage VGN3 to the gate of the level transistor 124, the gate voltage VGN3 changing in the same way as the gate voltage VGN2. That is, when the gate voltage VGN2 is the high-level voltage VH, the gate voltage VGN3 is also the high-level voltage VH. When the gate voltage VGN2 is the low-level voltage VL, the gate voltage VGN3 is also the low-level voltage VLOW (or the low-level voltage VL).

In the following description of the embodiment, the CMOS image sensor 1 including the row drive circuit 12a having the circuit configuration shown in FIG. 4 is described.

The operation of the CMOS image sensor, particularly, the operation of the pixel circuit 11 in the n-th row and m-th column is described below with reference to FIG. 7.

Figure 7:
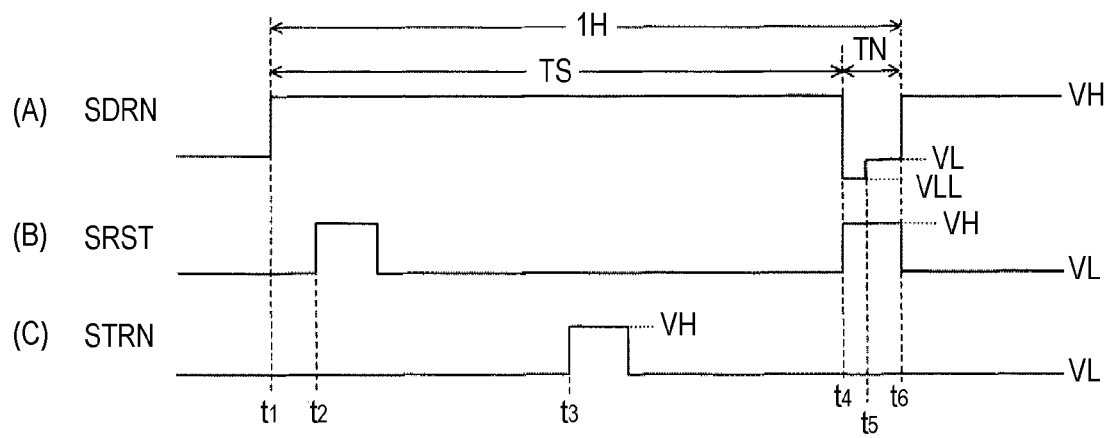
FIG. 7 is a timing chart showing an example of operation of the CMOS image sensor in accordance with the first embodiment.

FIG. 7 is a timing chart showing an example of operation of the CMOS image sensor in accordance with the first embodiment. FIG. 7(A) shows the drive signal SDRN. FIG. 7(B) shows the reset signal SRST. FIG. 7(C) shows the transfer signal STRN.

During the selected-state period TS from time t1 to time t4, the row drive circuit 12a applies the drive signal SDRN of the high-level voltage VH to the drive signal line DRNL (n) (see FIG. 7(A)).

At time t2, the row drive circuit 12a applies a pulse of the reset signal SRST (the high-level voltage VH) to the reset signal line RSTL(n) of the reset transistor 113 (see FIG. 7(B)).

During this pulse width, the reset transistor 113 is held in on-state. This resets the potential of the floating diffusion FD to the high-level voltage VH.

At time t3, the row drive circuit 12a applies a pulse of the transfer signal STRN (the high-level voltage VH) to the transfer signal line TRNL (n) of the transfer transistor 112 (see FIG. 7(C)).

During this pulse width, the transfer transistor 112 is held in on-state. This transfers the charge stored during the charge storing period by the photoelectric conversion device 111 to the floating diffusion FD.

When the charge is transferred from the photoelectric conversion device 111 to the floating diffusion FD, the potential of the floating diffusion FD varies depending on the amount of the charge, and this potential is applied to the gate of the amplifier transistor 114. Since the drain of the amplifier transistor 114 is applied with the source voltage VDD, the amplifier transistor 114 amplifies the potential of the floating diffusion FD depending on the voltage between the gate and source, and outputs the amplified potential to the vertical signal line VSL (m).

The horizontal transfer circuit 13 selects the vertical signal line VSL (m) by opening/closing the switch 132 for the m-th column, and reads out signal from the pixel circuits 11 of the selected column. At this point, the column circuit 131 converts analog voltage signal applied to the vertical signal line (m) into digital signal and outputs this digital signal to the horizontal transfer signal line HSCNL.

Then, the horizontal transfer circuit 13 outputs the CDS-processed digital signal as output signal SIG to a signal processor external to the CMOS image sensor 1.

After reading out the charge, the row drive circuit 12a stops the output of the amplifier transistor 114 to cause the pixel circuit 11 to be in non-selected state.

In more detail, during the non-selected-state setting period TN from time t4 to time t6, the row drive circuit 12a applies a pulse of the reset signal SRST (the high-level voltage VH) to the reset signal line RSTL of the reset transistor 113 (see FIG. 7(B)).

At the beginning of the non-selected-state setting period TN, the row drive circuit 12a applies a short pulse of the drive signal SDRN of the lowest level voltage VLL with a pulse width of T1 (FIG. 3) to the drive signal line DRNL (n) during a period from time t4 to time t5. This quickly decreases the voltage level of the drive signal SDRN from the high-level voltage VH to the lowest level voltage VLL.

Next, the row drive circuit 12a applies the drive signal SDRN of the low-level voltage VL to the drive signal line DRNL (n) during a period from time t5 to time t6.

As a result, the potential of the floating diffusion FD is set to the low-level voltage VL.

So, the gate of the amplifier transistor 114 is applied with the low-level voltage VL. When the selected-state period TS for the next row starts, the drain of the amplifier transistor 114 is applied with the source voltage VDD, and the vertical signal line VSL (m) is applied with a voltage signal (higher than the low-level voltage VL) by the reading-out of charge from the pixel circuit 11 of another row. Accordingly, the amplifier transistor 114 is held in off-state while the another row is selected.

As described above, the reset transistor 113 controls the output of the amplifier transistor 114 by setting the potential of the floating diffusion FD to the high-level voltage VH, the low-level voltage VL or the lowest level voltage VLL.

The amplifier transistor 114 amplifies the potential of the floating diffusion FD and outputs the amplified potential as voltage signal to the vertical signal line VSL (m).

This completes the operation of the CMOS image sensor 1 in one horizontal period H.

According to the first embodiment, in the 3-transistor-driven pixel circuit 11, the drain of the reset transistor 113 is connected to the drive signal line DRNL (n), and the drain of the amplifier transistor 114 is connected to the source voltage VDD.

During the non-selected-state setting period TN for the pixel circuit 11, the row drive circuit 12a quickly decreases the voltage level applied to the drive signal line DRNL (n) from the high-level voltage VH to the lowest level voltage VLL, then increases it from the lowest level voltage VLL to the low-level voltage VL, and then gradually returns it to the high-level voltage VH.

Therefore, the 3-transistor-driven pixel circuit can be driven at high speed to read out a pixel at high frame rate. This point is described below with reference to FIGS. 8 to 10.

Figure 8:
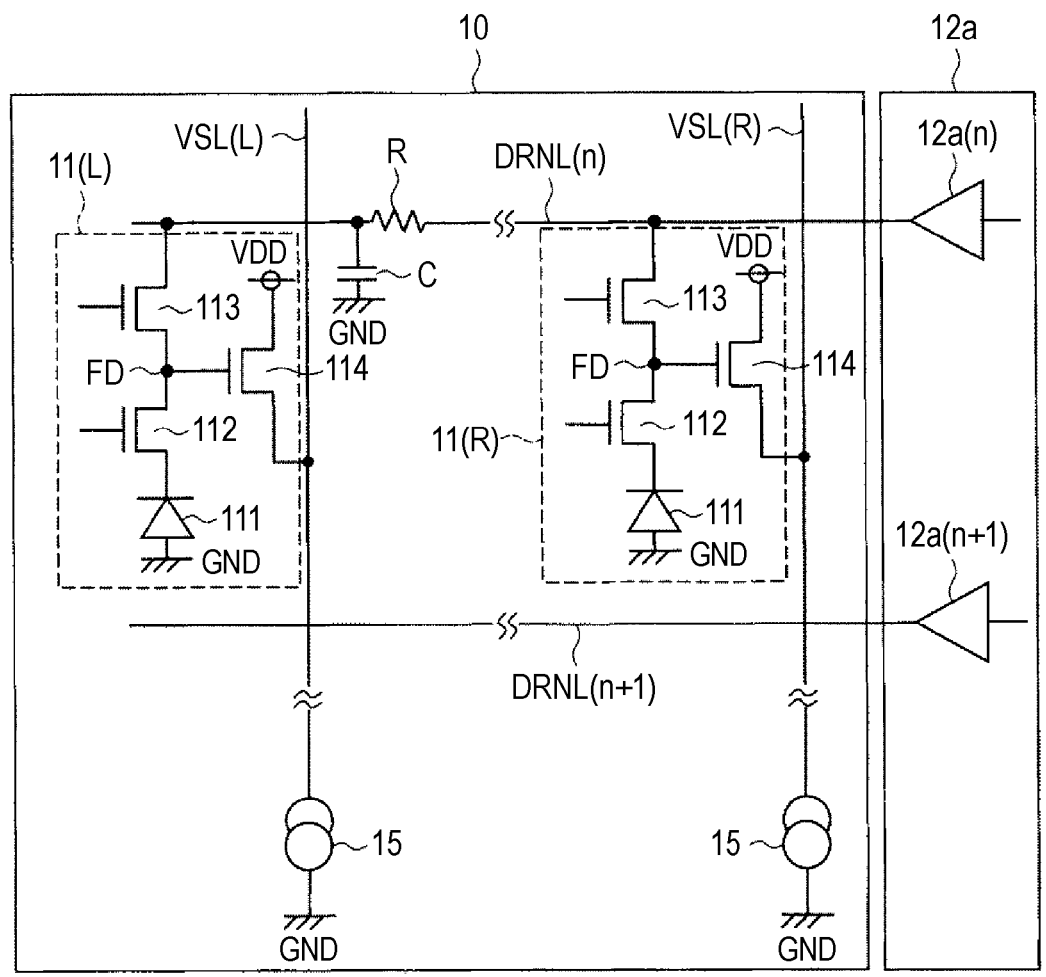
FIG. 8 is an equivalent circuit diagram showing a detailed example of a pixel section and the row drive circuit in accordance with the first embodiment.

FIG. 8 is an equivalent circuit diagram showing a detailed example of the pixel section and the row drive circuit in accordance with the first embodiment. However, FIG. 8 shows the pixel circuits 11 in the n-th row, with the reset signal line RSTL and the like not shown appropriately. A reference numeral 12a(n) shown in FIG. 8 denotes the n-th row part of the row drive circuit 12a (see FIG. 4).

In the n-th row, the pixel circuit 11(L) in the first column farthest from the row drive circuit 12a (n) and the pixel circuit 11(R) in the last column closest to the row drive circuit 12a(n) are commonly connected to the drive signal line DRNL (n) in which wiring resistance R and parasitic capacitance C exist.

Accordingly, the drive signal SDRN is attenuated by the wiring resistance R and delayed by the parasitic capacitance C on the way from the pixel circuit 11(R) to the pixel circuit 11(L). How the drive signal SDRN propagates, simulated using a computer, is described below with reference to FIG. 9.

Figure 9:
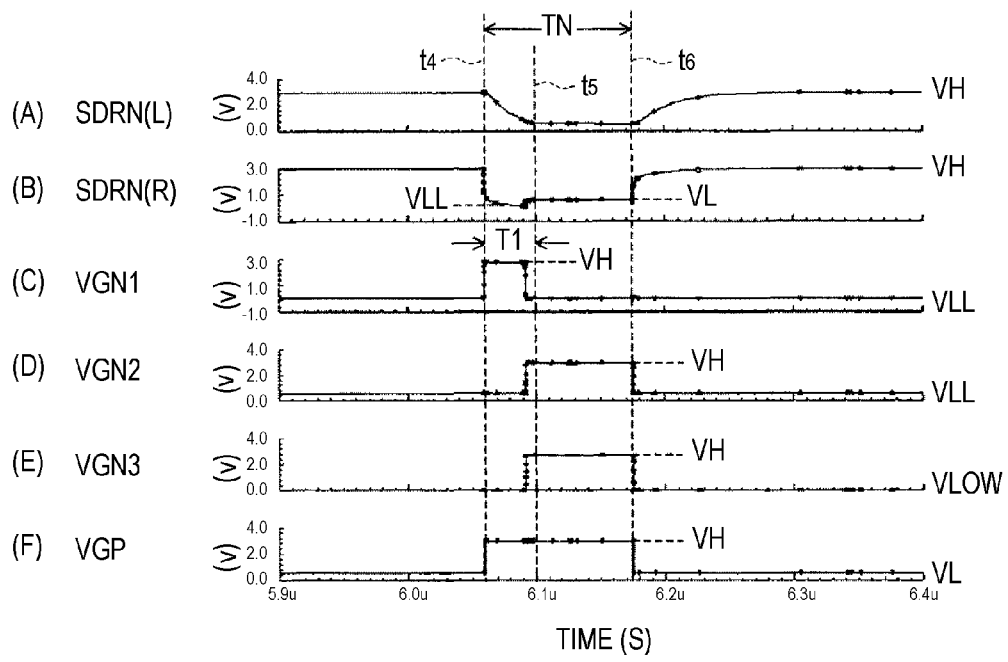
FIG. 9 shows a result of simulation for the CMOS image sensor in accordance with the first embodiment.

FIG. 9 shows a result of simulation for the CMOS image sensor in accordance with the first embodiment.

FIG. 9(A) shows a waveform of the drive signal SDRN(L) when the drive signal SDRN (see FIG. 7(A)) reaches the pixel circuit 11(L) (see FIG. 8). FIG. 9(B) shows a waveform of the drive signal SDRN(R) when the drive signal SDRN reaches the pixel circuit 11(R) (see FIG. 8).

FIG. 9(C) shows the gate voltage VGN1 (see FIG. 6(B)). FIG. 9(D) shows the gate voltage VGN2 (see FIG. 6(C)). FIG. 9(E) shows the gate voltage VGN3 (see FIG. 6(D)). FIG. 9(F) shows the gate voltage VGP (see FIG. 6(E)).

Note that, in FIG. 9, the horizontal axis shows the time (s), and the vertical axis shows the voltage (V) of the drive signal SDRN. The gate voltage VGN2 rises from the lowest level voltage VLL to the high-level voltage VH slightly earlier than time t5. The gate voltage VGN3 rises in the same way as VGN2.

In the pixel circuit 11(R) closest to the row drive circuit 12a, the drain of the reset transistor 113 is applied with the drive signal SDRN(R) the waveform of which is shown in FIG. 9(B). This drive signal SDRN(R) quickly falls from the high-level voltage VH to the lowest level voltage VLL at time t4.

In a period during which the gate voltage VGN1 with a pulse width of T1 is applied to the gate of the level transistor 121 (see FIG. 9(C)), the drive signal SDRN(R) is held almost constantly to the lowest level voltage VLL (see FIG. 9(B)). That is, the drive signal SDRN(R) undershoots to the lowest level voltage VLL exceeding the low-level voltage VL.

When the drive signal SDRN reaches the pixel circuit 11(L) farthest from the row drive circuit 12a, the drain of the reset transistor 113 is applied with the drive signal SDRN(L) the waveform of which is shown in FIG. 9(A).

Since the drive signal SDRN is attenuated by the wiring resistance R, the drive signal SDRN does not undershoot to the lowest level voltage VLL, and the falling of the drive signal SDRN(L) is much smoother than that of the drive signal SDRN(R). Because of delay due to the parasitic capacitance C, the drive signal SDRN(L) reaches the low-level voltage VL from the high-level voltage VH at time t5.

Therefore, applying the low-level voltage VL to the gate of the amplifier transistor 114 of the pixel circuit 11 in the n-th row during the non-selected-state setting period TN can place the n-th row in non-selected-state.

In this way, taking the wiring resistance R and the parasitic capacitance C of the drive signal line DRNL (n) into consideration, the row drive circuit 12a applies the undershooting drive signal SDRN to the drive signal line DRNL (n) to shorten the falling time of the drive signal SDRN.

Figure 10:
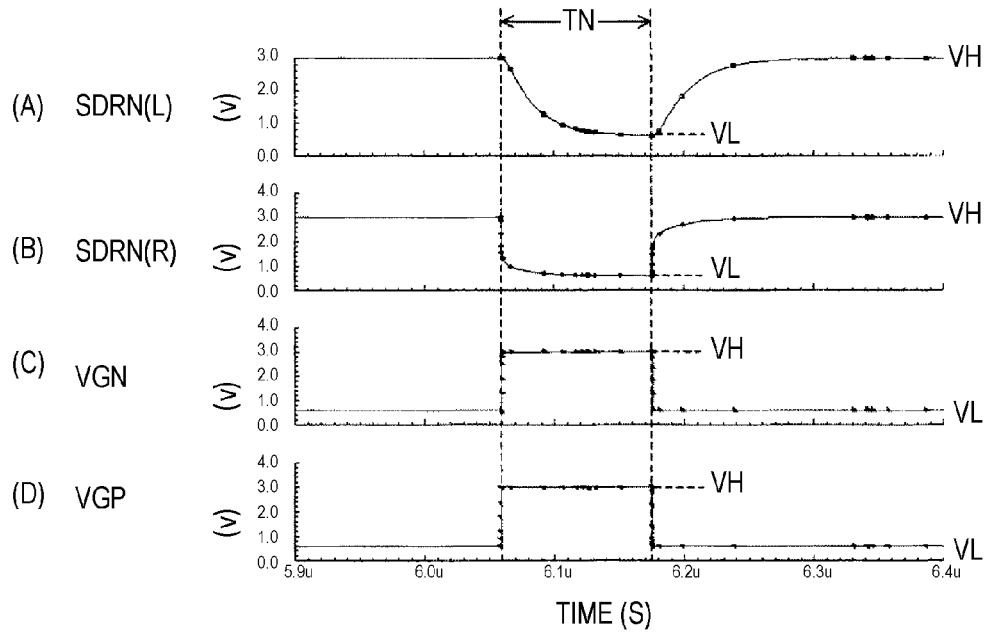
FIG. 10 shows a result of the simulation for a conventional CMOS image sensor.
Figure 13:
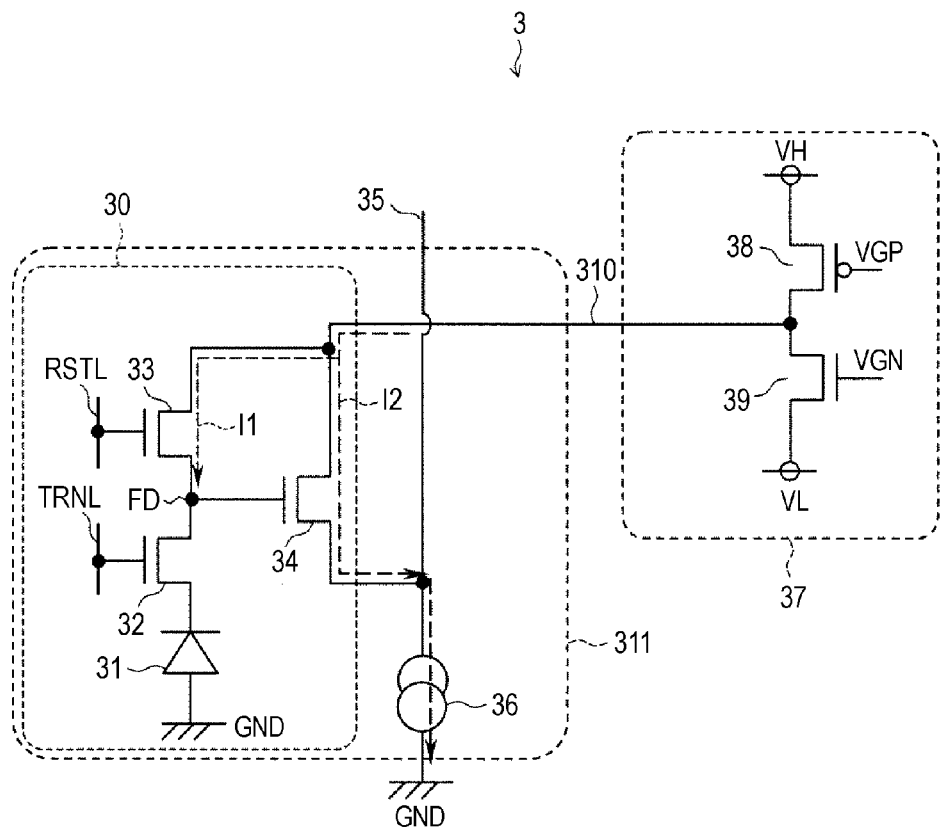
FIG. 13 is an equivalent circuit diagram of the main part showing an example of configuration of the conventional CMOS image sensor.

For the conventional CMOS image sensor 3 shown in FIG. 13, the drive signal SDRN propagates as shown in FIG. 10.

FIG. 10 shows a result of the simulation for the conventional CMOS image sensor.

Figure 14:
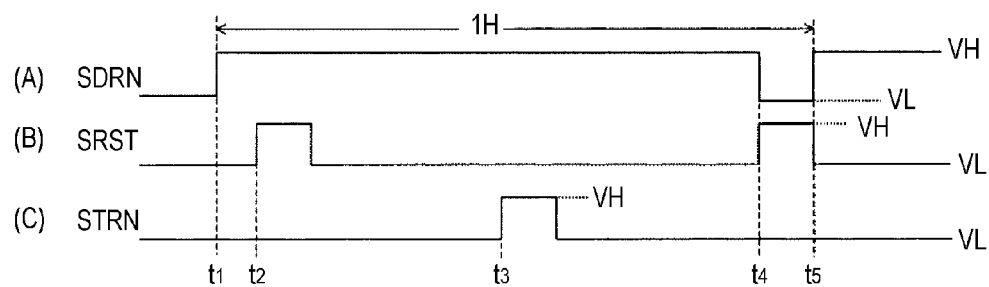
FIG. 14 is a timing chart of the CMOS image sensor shown in FIG. 13.

FIG. 10(A) shows a waveform of the drive signal SDRN(L) when the drive signal SDRN (see FIG. 14(A)) reaches the pixel circuit 30(L) (see FIG. 13). FIG. 10(B) shows a waveform of the drive signal SDRN(R) when the drive signal SDRN reaches the pixel circuit 30(R).

FIG. 10(C) shows a gate voltage VGN applied to the gate of the transistor 39. FIG. 10(D) shows a gate voltage VGP applied to the gate of the transistor 38.

The pixel circuit 30(L) in the first column farthest from the row drive circuit 37 and the pixel circuit 30(R) in the last column closest to the row drive circuit 37 are commonly connected to the drive signal line 310 in which the wiring resistance R and the parasitic capacitance C exist.

For the conventional CMOS image sensor 3, in order to cause both the drive signals SDRN(L) and SDRN(R) to converge to the low-level voltage VL within the non-selected-state setting period TN (see FIGS. 10(A) and 10(B)), the non-selected-state setting period TN needs to be 0.1 μs or so longer than that for the drive signals SDRN(L) and SDRN(R) shown in FIG. 9.

Shortening the non-selected-state setting period TN is essential for driving the 3-transistor-driven pixel circuit at high-speed. As described above, the CMOS image sensor in accordance with the first embodiment, can substantially shorten the non-selected-state setting period TN in comparison with the conventional one and drive the pixel circuit at high speed as well as reading out a pixel at high frame rate.

As described above, despite the steep falling of the drive signal SDRN, the fluctuation of the potential of the p-type well of the transistors included in the pixel circuit 11 can be reduced to prevent shading. This point is described below with reference to FIG. 13 again.

In the conventional 3-transistor-driven CMOS image sensor 3, there are two current paths from the pixel circuit 30 to the vertical signal line 35.

A first current path I1 is from the drive signal line 310 to the vertical signal line 35 via the reset transistor 33 and the floating diffusion FD (see a dashed arrow in FIG. 13).

A second current path I2 is from the drive signal line 310 to the vertical signal line 35 via the amplifier transistor 34 (see a dashed arrow in FIG. 13).

The two current paths are a result of commonly connecting the drain of the reset transistor 33 and the drain of the amplifier transistor 34 to the drive signal line 310. Additionally, the impedance of the second current path I2 is lower than that of the first current path I1, so the drive signal SDRN needs to be strongly buffered. This buffering causes the potential of the p-type well of the transistors included in the pixel circuit 30 to fluctuate intensely.

On the other hand, in the first embodiment, the drain of the reset transistor 113 is connected to the drive signal line DRNL (n), and the drain of the amplifier transistor 114 is connected to the source voltage VDD, so the second current path I2 does not exist, which can reduce the above-described fluctuation of the potential of the p-type well.

Thus, even if the drive signal SDRN falls steeply, shading may be reduced.

Note that the high-level voltage VH to be applied to the drive signal line DRNL (n) does not need to be equal to the source voltage VDD connected to the drain of the amplifier transistor 114. In order to achieve low power consumption, the high-level voltage VH may be set to be lower than the source voltage VDD (VDD>VH>VL). On the other hand, the source voltage VDD may be set to be lower than the high-level voltage VH (VH>VDD>VL).

Setting the high-level voltage VH to a higher voltage allows the floating diffusion FD to be reset by the higher voltage to increase saturating signal quantity. Also, four or more voltage level values may be used to gradually return the drive signal SDRN from the lowest level voltage VLL to the high-level voltage VH during the non-selected-state setting period TN.

For example, in the case of using four-valued voltage level, a fourth voltage level higher than the low-level voltage VL and lower than the high-level voltage VH may be used to allow the drive signal SDRN to return from the lowest level voltage VLL to the high-level voltage VH via the low-level voltage VL and the fourth voltage level.

Second Embodiment

In the first embodiment, the drive signal SDRN is applied to one end of the drive signal line DRNL (n) (see FIG. 8). On the other hand, in a second embodiment, the drive signal SDRN is applied to both ends of the drive signal line DRNL (n).

Figure 11:
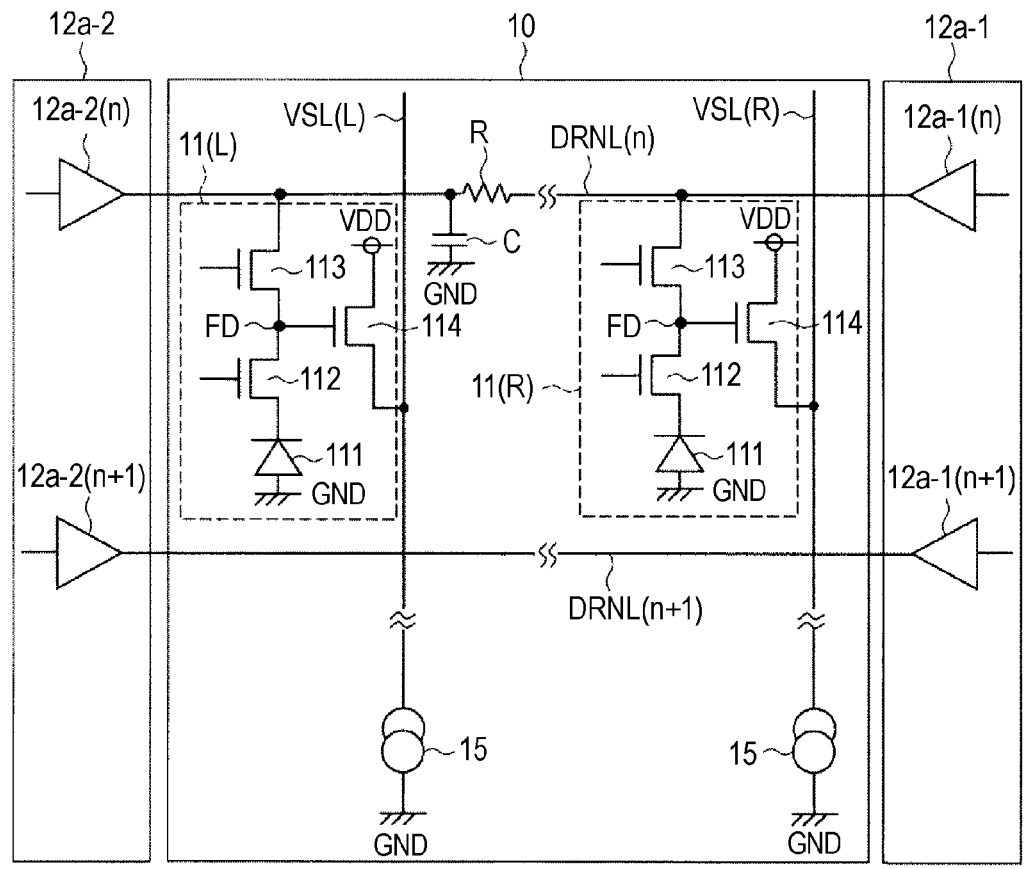
FIG. 11 is an equivalent circuit diagram showing a detailed example of the pixel section and the row drive circuit in accordance with a second embodiment.

FIG. 11 is an equivalent circuit diagram showing a detailed example of the pixel section and the row drive circuit in accordance with the second embodiment. However, FIG. 11 shows the pixel circuits 11 in the n-th row, with the reset signal line RSTL and the like not shown appropriately. Reference numerals 12a-1(n), 12a-2(n) shown in FIG. 11 denote the n-th row parts of the row drive circuits 12a-1, 12a-2.

As shown in FIG. 11, the row drive circuits 12a-1, 12a-2 configured similarly to the circuit shown in FIG. 4 are placed on both sides of the pixel section 10. The row drive circuit 12a-1(n) is connected to one end of the drive signal line DRNL (n). The row drive circuit 12a-2(n) is connected to the other end of the drive signal line DRNL (n).

The row drive circuits 12a-1, 12a-2 simultaneously apply the drive signal SDRN to the drive signal line DRNL (n) at the timing shown in FIG. 6(A).

Among the pixel circuits 11 connected to the drive signal line DRNL (n), the pixel circuit 11 placed at the center receives the drive signal SDRN from the both ends of the drive signal line DRNL (n). Thus, the CMOS image sensor in accordance with the second embodiment can drive the pixel circuit 11 at speed higher than that in accordance with the first embodiment.

With this ability, the CMOS image sensor 1 can be used as an imaging device for a digital camera, video camera and the like.

Figure 12:
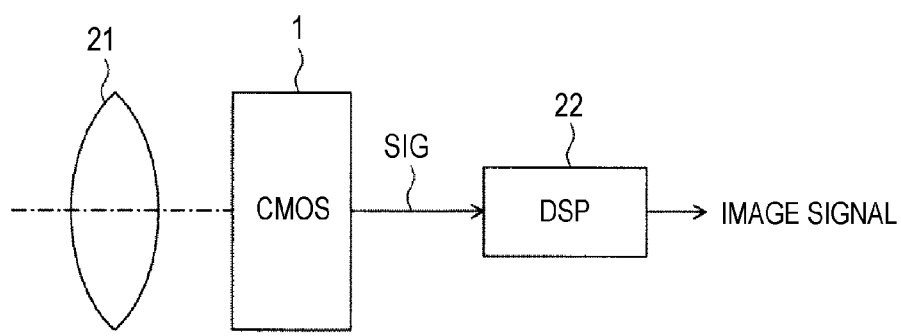
FIG. 12 shows an example of configuration of a camera for which the CMOS image sensor in accordance with the embodiments of the invention is used.

FIG. 12 shows an example of configuration of a camera for which the CMOS image sensor in accordance with the embodiments of the invention is used.

As shown in FIG. 12, a camera 2 includes the CMOS image sensor 1 as an imaging device, an optical system for guiding incident light to (forming an object image on) the pixel area (pixel section 10) of the CMOS image sensor 1, and a signal processor (DSP) 22 for processing output signal SIG of the CMOS image sensor 1. For example, the optical system includes a lens 21 for focusing incident light (image light) on an imaging surface.

The signal processor 22 performs image processing on the output signal SIG from the CMOS image sensor 1. Image signal processed by the signal processor 22 is recorded to a recording medium such as memory. Image information recorded in the recording medium is output in hardcopy by a printer or the like. The image signal processed by the signal processor 22 is displayed as moving picture on a monitor including a liquid crystal display.

As described above, including the CMOS image sensor in a camera and the like can allow the camera to reduce noises including shading and also read out a pixel at high speed.

DESCRIPTION OF REFERENCE NUMERALS AND SIGNS

1 CMOS image sensor
2 camera
3 CMOS image sensor
10 pixel section
11 pixel circuit
12 row drive circuit
13 horizontal transfer circuit
14 timing generator
15 constant current source circuit
21 lens
22 signal processor
111 photoelectric conversion device
112 transfer transistor
113 reset transistor
114 amplifier transistor
121 to 124 level transistor
131 column circuit
132 switch
DRNL drive signal line
FD floating diffusion
RSTL reset signal line
TRNL transfer signal line

The invention claimed is:

1. A method for controlling an imaging device, a plurality of pixel circuits, each pixel circuit photoelectrically converting incident light into charge, the method comprising:
   (a) for each pixel circuit,
      transferring the charge photoelectrically converted by a photoelectric converter to a node,
      amplifying the potential of the node up to a first voltage based on a first voltage source and outputting a voltage depending on the amount of the charge as an output signal to an output signal line, and
      setting the potential of the node to voltages of at least two different levels other than zero by using a control transistor based on a second voltage source different from the first voltage source; and
   (b) stopping the signals output from the plurality of pixel circuits for a predetermined period after the reading-out of the charges by the plurality of pixel circuits,
   wherein,
      the second voltage source is switched directly from a high voltage level to a low voltage level, then switched directly from the low voltage level to a medium voltage level, and then switched directly from the medium voltage level to the high voltage level.

2. The method of claim 1, wherein the switch of the second voltage source from the high voltage level to the low voltage level is performed more quickly than the switch from the low voltage level to the high voltage level.

3. A camera comprising:
   an imaging device;
   an optical system for guiding incident light to a pixel area of the imaging device; and
   a signal processor for processing output signal from the imaging device,
   wherein,
      the imaging device comprises (a) a first voltage source, (b) a second voltage source different from the first voltage source, (c) an output line, and (d) a plurality of pixel circuits,
      each pixel circuit comprises (a) a photoelectric converter configured to convert incident light into charges, (b) a node where the charges can be stored after transfer thereto from the photoelectric converter, (c) a first transistor, and (d) a second transistor,
      the first transistor of each pixel circuit has a control terminal connected to the node, a first terminal connected to the first voltage source, and a second terminal connected to the output line,
      the second transistor of each pixel circuit has a third terminal connected to the second voltage source, a fourth terminal connected to the node, a control terminal used for activating the second transistor
      the second voltage source generates voltages of two or more levels other than zero, and
      the second voltage source is switched directly from a high voltage level to a low voltage level, then switched directly from the low voltage level to a medium voltage level, and then switched directly from the medium voltage level to the high voltage level.

4. The camera of claim 3, wherein the second voltage source circuit comprises:
   a fourth transistor connected between a voltage at the first level and an output of the second voltage source circuit;

a fifth transistor connected between a voltage at the second level and the output of the second voltage source; and a sixth transistor connected between a voltage at the third level and the output of the second voltage source.

5. The camera of claim 3, wherein the switch of the second voltage source from the high voltage level to the low voltage level is performed more quickly than the switch from the low voltage level to the high voltage level.

6. An imaging sensor comprising:

a first voltage source;

a second voltage source different from the first voltage source;

an output line; and a plurality of pixel circuits, wherein, each pixel circuit comprises (a) a photoelectric converter configured to convert incident light into charges, (b) a node where the charges can be stored after transfer thereto from the photoelectric converter, (c) a first transistor, and (d) a second transistor, the first transistor has a control terminal connected to the node, a first terminal connected to the first voltage source, and a second terminal connected to the output line, the second transistor has a third terminal connected to the second voltage source, a fourth terminal connected to the node, a control terminal used for activating the second transistor, the second voltage source generates voltages of two or more levels other than zero, and the second voltage source is switched directly from a high voltage level to a low voltage level, then switched directly from the low voltage level to a medium voltage level, and then switched directly from the medium voltage level to the high voltage level.

7. The imaging sensor of claim 6, wherein the second voltage source circuit comprises:

a fourth transistor connected between a voltage at the first level and an output of the second voltage source circuit;

a fifth transistor connected between a voltage at the second level and the output of the second voltage source; and a sixth transistor connected between a voltage at the third level and the output of the second voltage source.

8. The image sensor of claim 6, wherein the switch of the second voltage source from the high voltage level to the low voltage level is performed more quickly than the switch from the low voltage level to the high voltage level.

* * * * *